United States Patent
Farassat

(10) Patent No.: US 6,786,320 B2
(45) Date of Patent: Sep. 7, 2004

(54) CHIP-TRANSFERRING STATION FOR A BONDING MACHINE

(75) Inventor: Farhad Farassat, Taufkirchen (DE)

(73) Assignee: F & K Delvotec Bondtechnik GmbH, Ottobrunn (DE)

(*) Notice: Subject to any disclaimer, the term of this patent is extended or adjusted under 35 U.S.C. 154(b) by 0 days.

(21) Appl. No.: 10/358,422

(22) Filed: Feb. 4, 2003

(65) Prior Publication Data

US 2004/0099509 A1 May 27, 2004

(30) Foreign Application Priority Data

Nov. 25, 2002 (EP) .............................................. 02026386

(51) Int. Cl.⁷ .............................................. B65G 47/24
(52) U.S. Cl. ................ 198/409; 198/468.4; 198/750.12
(58) Field of Search .................................. 198/403, 409, 198/468.4, 750.12; 414/728, 752.1

(56) References Cited

U.S. PATENT DOCUMENTS 3,494,482 A * 2/1970 Lense .......................... 198/409

FOREIGN PATENT DOCUMENTS

EP          1 057 388 B1    12/1999
JP          02 056944       2/1990

* cited by examiner

Primary Examiner—Joseph E. Valenza
(74) Attorney, Agent, or Firm—Knobbe, Martens, Olson & Bear, LLP

(57) ABSTRACT

A bonding machine chip-transferring station, with a multi-axial positioning mechanism and a suction-needle module mounted and positionable thereon, with a housing, a suction needle connected to a vacuum conduit, and a suction-needle conveyance unit, including a drive motor, a belt transmission coupled thereto, and a suction-needle reversal means driven by the transmission, wherein the suction-needle reversal means includes a suction-needle holder seated on an axle and a pulley nonrotatably connected to the axle, where the suction-needle holder includes a guide block on which is mounted a suction-needle carriage movable only in the Z direction, supports the suction needle, and bears a carrier bolt oriented parallel to the axle, and an actuator fork nonrotatably connected to the pulley, via the axle, with which is engaged the carrier bolt extending from the suction-needle carriage and by means of which the suction-needle carriage is driven and constrained exclusively in the ±Z directions.

10 Claims, 2 Drawing Sheets

CHIP-TRANSFERRING STATION FOR A BONDING MACHINE

RELATED APPLICATIONS

This application claims the benefit of the European Application No.: 02 026 386.9 filed Nov. 25, 2002 in the European Patent Office.

BACKGROUND OF THE INVENTION

1. Field of the Invention

The invention relates to a chip-transferring station for a bonding machine, in particular a flip-chip bonder. This station is a device for picking up electronic circuits that are laid out on a carrier film and transferring them to a circuit board, in particular a ceramic substrate.

2. Description of the Related Art

In the known flip-chip method the circuits (chips) in the bonding machine are raised from the film by pins positioned below the film, and are then picked up by a suction needle, rotated through 180°, transferred to another suction needle and finally, for direct bonding, are positioned precisely relative to the circuit board by placing them on associated contact tracks. An apparatus of this kind is described in the patent JP 02 056944; see also Patent Abstracts of Japan, Vol. 014, No. 225 (E-0927) dated May 14, 1990. Another such device is known from the patent EP 1 057 388 B1.

SUMMARY OF INVENTION

The objective of the present invention is to make available an improved apparatus of this kind, which in particular on one hand can position the chips with high precision and on the other hand functions reliably and in such a way as not to damage the delicate chips or the contact tracks on the circuit board.

This objective is achieved by a chip-transferring station for a bonding machine with a multi-axial positioning mechanism and a suction-needle module mounted on and positionable by the positioning mechanism with a housing, a suction-needle connected to a vacuum circuit for the purpose of picking up chips and a suction-needle conveyance unit which comprises a drive motor, a belt transmission coupled thereto, and a suction-needle reversal means driven by the belt transmission, wherein the suction-needle reversal means comprises a suction-needle holder mounted on a swiveling axle and a pulley nonrotatably connected to the swiveling axle, wherein the suction-needle holder comprises a guide block on which is mounted a suction-needle carriage that can be moved only in the z direction and supports the suction-needle, and which bears a carrier bolt oriented parallel to the swiveling axle, and wherein there is nonrotatably connected to the pulley, by way of the swiveling axle, an actuator fork with which is engaged the carrier bolt extending from the suction-needle carriage and by means of which the suction-needle carriage is driven and constrained to travel exclusively in the ±Z directions, wherein the guide block on the axle can be swiveled over an angular extent limited to 180° by stopping devices, and wherein the actuator fork can swivel by more than 180°. Advantageous further developments of the idea underlying the invention of the subject matter of the dependent claims.

The proposed chip-transferring staion has a multi-axial positioning mechanism that is mounted on a base body, as well as a suction-needle module that can be positioned by the positioning mechanism and includes a (first) suction needle attached to a vacuum conduit. The positioning mechanism incorporates a suction-needle conveyance unit comprising a drive motor to which is coupled a belt, and a suction-needle reversing means driven by said belt. The reversing means comprises a suction-needle holder seated on a swivelling axle and a pulley that is fixedly connected to the swivelling axle.

The invention includes the idea of constructing the suction-needle holder as—in a simplified description—a guide block with a sliding carriage that is seated on the guide block and provides the actual holder for the suction needle. In addition, the invention encompasses the idea that the suction-needle carriage is actuated by way of an actuator fork that is nonrotatably connected to the pulley by way of the swivelling axle and holds between its prongs a peg or bolt attached to the carriage. By means of the actuator fork, according to one essential aspect of the invention, the suction-needle carriage is driven and its movement restricted to the positive and negative Z directions.

Whereas the rotation of the guide block itself on the swivelling axle is limited by a stopping device to exactly 180°, and the the actuator fork can be rotated through more than 180°, the result of actuating and guiding the carriage in this way is that while the suction needle approaches and touches the chip surface, it moves along a precisely positioned vertical path. That is, relative lateral movements between suction needle and chip surface, which might otherwise occur when the chip is being picked up by the suction needle and would present a considerable risk of damage and hence wastage, are reliably prevented.

In a preferred embodiment of the invention the mounting of the suction-needle carriage in the guide block is spring-loaded, and/or the suction needle is resiliently attached to the carriage. In an even more specialized design, the suction-needle carriage is constructed as a tandem carriage, the first component of which can be moved in the Z direction within a slideway in the guide block while the second component can be moved under spring loading within a Z slideway in the first carriage component.

This use of springs in combination allows the suction needle to approach the chip surface under "soft" guidance, while avoiding damage to the surface by unacceptably large vertical pressures (which are the only remaining source of danger to the chip, once lateral relative movements have been excluded by the above-mentioned fork guidance).

In a first useful design—which from the present viewpoint is preferred—to implement spring-loaded guidance of the suction-needle carriage on the guide block, or of the first component of a tandem carriage, a vertical guide means is disposed in the guide block in the form of a helical spring, which acts as a compression spring between guide block and carriage. In an embodiment alternative to this, the spring tension between the two components is produced by a spiral spring associated with the swivelling axle. It should be understood that instead of steel springs, elastomer spring elements can also be used here.

In the case of the above-mentioned tandem construction of the suction-needle carriage, the spring-loaded guidance of the second carriage component with respect to the first component is preferably brought about by a traction spring disposed between the two components. In particular, again, this takes the form of a helical steel spring, but it can also be formed by an elastomer element.

In order to apply the necessary vacuum to the suction needle in a structurally simple manner, the swivelling axle is made hollow so as to form part of the vacuum conduit, and is connected to a proximal end of the suction needle by way of a flexible or rigid tube.

The above-mentioned exact delimitation of the swivelling movement of the whole suction-needle holder, in particular the carriage part, is advantageously accomplished by two stopping devices disposed on the base body of the chip-transferring station. These can, if necessary, be made adjustable, and they act on one hand to ensure that the needle moves precisely perpendicular to the chip surface during its approach, and on the other hand to establish an equally well-defined position at which the chip is transferred to the second suction needle.

BRIEF DESCRIPTION OF THE DRAWINGS

Other advantages and useful features of the invention will be evident in the following description of a preferred exemplary embodiment with reference to the figures, wherein.

DETAILED DESCRIPTION OF THE PREFERRED EMBODIMENTS

Figure 1:
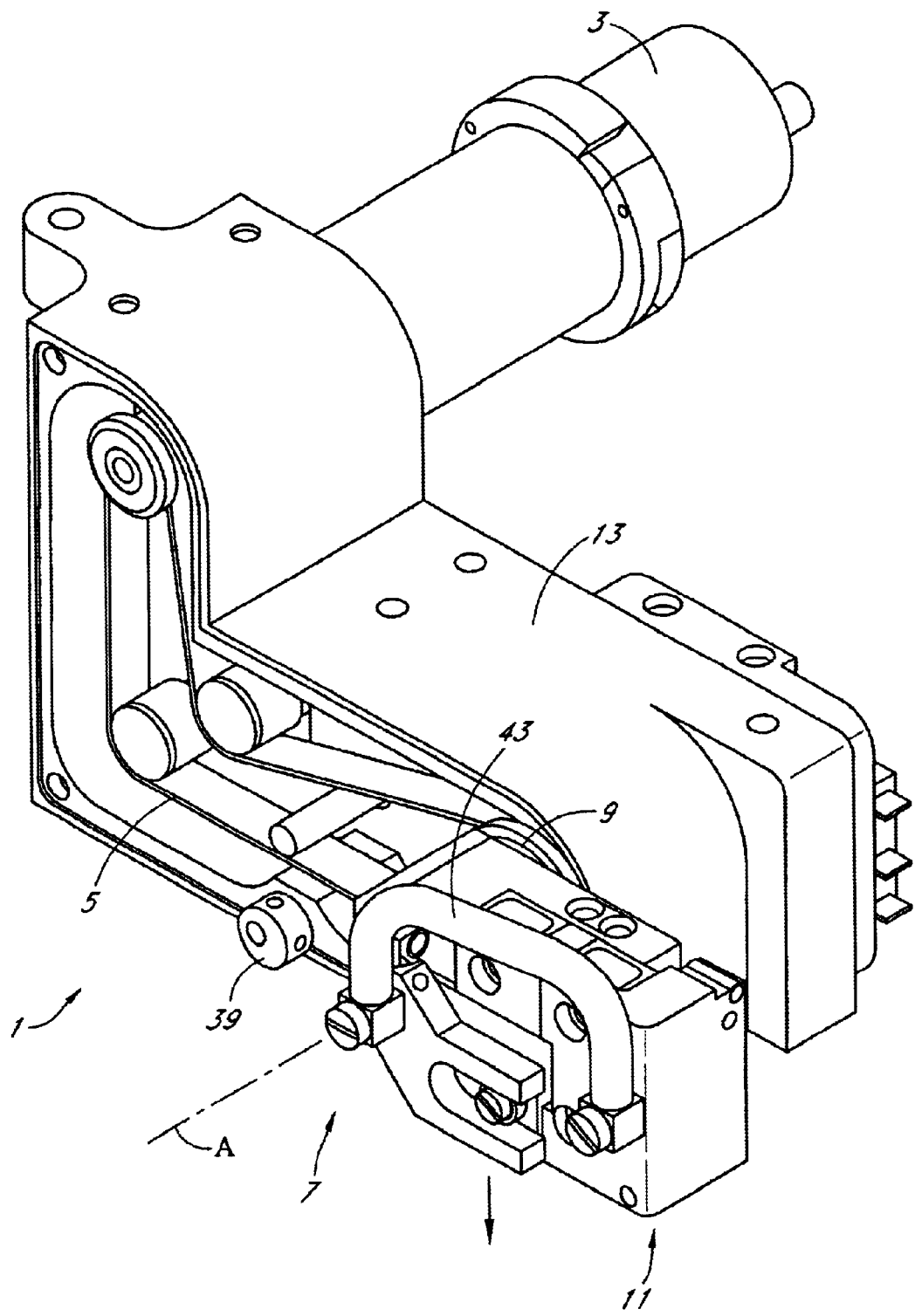
FIG. 1 is a perspective drawing of a suction-needle conveyance unit according to one embodiment of the invention (with cover partly removed)

FIG. 1 shows a suction-needle conveyance unit 1, which constitutes a crucial component of a chip-transferring station in accordance with the invention for use as part of a flip-chip bonder. Elements of the suction-needle conveyance unit include a drive motor 3, to which is coupled a belt transmission 5, and a suction-needle reversal means 7 that is driven by the belt. The reversal means comprises a pulley 9 (almost obscured by other elements in the drawing) that engages with the belt of the belt transmission, and a suction-needle holder 11 that can rotate about a swivelling axle A. The suction-needle conveyance unit 1 is disposed in or on a housing 13; the suction needle itself has been omitted from the figures.

Figure 2:
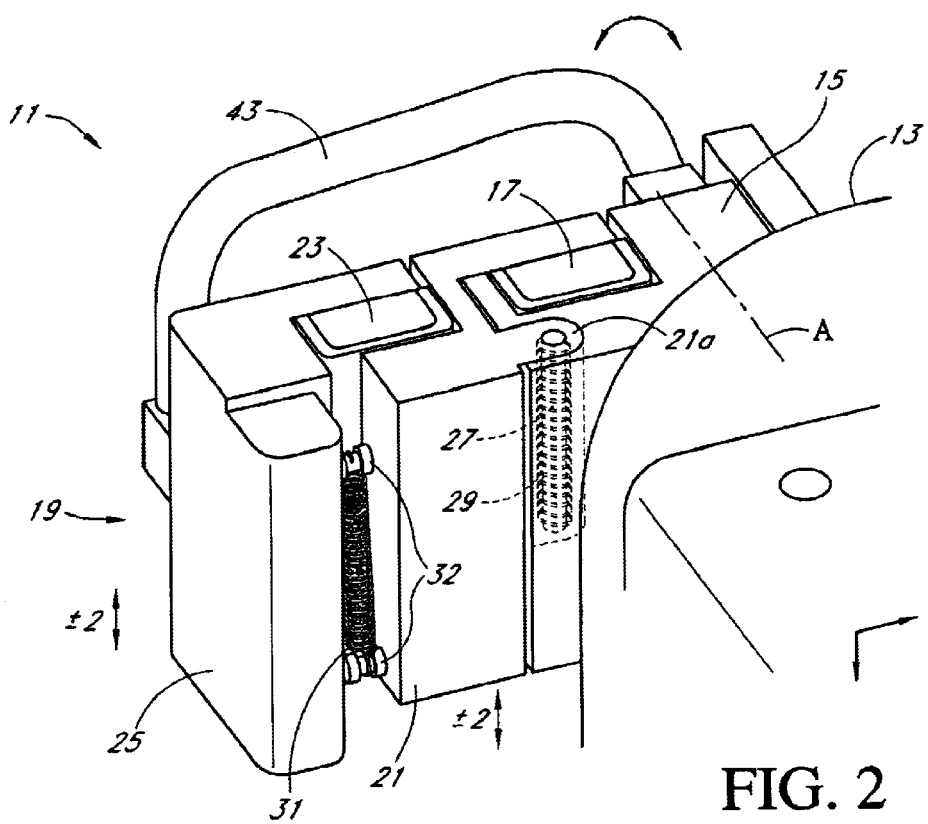
FIGS. 2 and 3 are perspective views, from different angles, of a suction-needle reversal means that forms part of the suction-needle conveyance unit.
Figure 3:
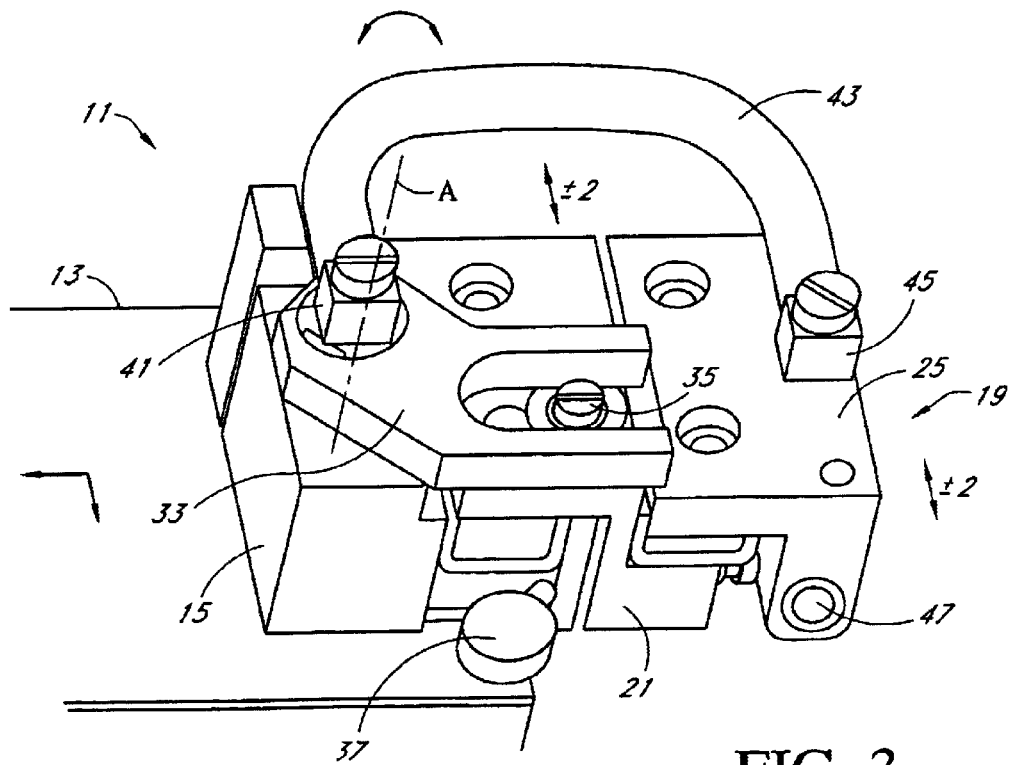

As shown in FIGS. 2 and 3, the suction-needle holder comprises a guide block 15, seated fixedly on the swivelling axle A, and a tandem sliding carriage 19, which is mounted on the guide block 15 so that it can be moved in the Z direction by way of a first slideway 17. This carriage comprises a first carriage component 21, which is in direct engagement with the slideway 17, and a second carriage component 25, which is mounted on the first component 21 in such a way that it can be moved in the Z direction by way of a second slideway 23. Next to the slideway 17 in the guide block 15 is disposed a vertical guide rod 27, which is surrounded by a first helical steel is spring 29.

A projection 21a on the surface of the first carriage component 21, which is provided with an appropriate bore, encloses the guide rod 27 and forms an (upper) abutment for the helical spring 29, which is supported at its lower end against an abutment (not shown as such) in the guide block 15. The helical spring 29 acts as a compression spring, applying stress that, in the operating position of the suction-needle holder 11 shown in FIG. 2 and FIG. 3, tends to force the tandem carriage 19 into its uppermost allowable position with respect to the guide block 15.

Adjacent to the second slideway 23, the first carriage component 21 and the second carriage component 25 each comprise a rod or bolt 32, between which a second helical steel spring 31 is attached as a traction spring. This tends to pull the two parts 21, 25 into the lowest allowable relative position, but permits the second carriage component 25 to escape upward in case the suction-needle (not shown) that is mounted below it should encounter an obstacle (specifically, the surface of a chip to be transferred) during a downward movement of the tandem carriage 19.

In FIG. 3 is shown an element for converting a rotational movement of the suction-needle holder about the axle A, mediated by the belt transmission 5 (FIG. 1), into a linear movement of the suction needle in the −Z direction. This element is an actuator fork 33, between the prongs of which is disposed a carrier bolt 35 that projects out of the side of the first carriage component 21 that faces the actuator fork. The suction-needle holder 11 is prevented from rotating by more than 180° about the axle A by a stopping device 37 on the housing 13, so that the rotational movement is converted into the above-mentioned, precisely guided vertical movement of the tandem carriage 19 by which the latter approaches the surface of a chip to be transferred. At this juncture it should be pointed out also that an additional stopping device 39 on the housing 13 (FIG. 1) limits, in an analogous manner, the swivelling movement of the suction-needle holder in the other direction of rotation.

So that the suction needle can hold onto the chip, the pressure therein is lowered by way of a conduit passing from a first vacuum connector 41 at the guide block 15 through a connecting tubule 43, a second vacuum connector 45 at the second carriage component 25 and a suction-needle connector 47 on the underside of the second carriage component 25, and terminating at the distal end of the suction needle.

The implementation of the invention is not restricted to the example described above and the aspects presented in connection therewith, but is also possible in a large number of modifications that are within the competence of a person skilled in the art. In particular, a variety of combinations of the above-mentioned aspects of the proposed solution are within the scope of the invention.

| | List of reference numerals |
|---|---|
| 1 | Suction-needle conveyance unit |
| 3 | Drive motor |
| 5 | Belt transmission |
| 7 | Suction-needle reversal means |
| 9 | Pulley |
| 11 | Suction-needle holder |
| 13 | Housing |
| 15 | Guide block |
| 17, 23 | Slideway |
| 19 | Tandem carriage |
| 21, 25 | Carriage component |
| 21a | Projection |
| 27 | Guide rod |
| 29 | Helical steel spring (compression spring) |
| 31 | Helical steel spring (traction spring) |
| 33 | Actuator fork |
| 35 | Carrier bolt |
| 37, 39 | Stopping device |
| 41, 45 | Vacuum connector |
| 43 | Connecting tubule |
| 47 | Suction-needle connector |
| A | Swivelling axle. |

What is claimed is:

1. A chip-transferring station for a bonding machine with:
a multi-axial positioning mechanism and
a suction-needle module mounted on and positionable by the positioning mechanism, with a housing, a suction needle connected to a vacuum conduit for picking up chips, and a suction-needle conveyance unit, which comprises a drive motor, a belt transmission coupled thereto, and a suction-needle reversal means driven by the belt transmission, wherein the suction-needle reversal means comprises a suction-needle holder seated on a swivelling axle and a pulley nonrotatably connected to the swivelling axle, wherein the suction-needle holder comprises a guide block on which is mounted a suction-needle carriage that can be moved only in the Z direction and supports the suction needle, and which bears a carrier bolt oriented parallel to the swivelling axle, and wherein there is nonrotatably connected to the pulley, by way of the swivelling axle, an actuator fork with which is engaged the carrier bolt extending from the suction-needle carriage and by means of which the suction-needle carriage is driven and constrained to travel exclusively in the +Z and −Z directions, wherein the guide block on the axle can be swivelled over an angular extent limited to 180° by stopping devices, and the actuator fork can swivel by more than 180°.

2. The chip-transferring station of claim 1, wherein the suction-needle carriage is mounted in the guide block under spring loading.

3. The chip-transferring station of claim 1, wherein the suction-needle is resiliently attached to the suction-needle carriage.

4. The chip transferring station of claim 1 wherein the suction-needle carriage is constructed as a tandem carriage with a first carriage component movably disposed in a Z slideway of the guide block, and with a second carriage component that can be moved under spring loading in a Z slideway of the first carriage component.

5. The chip-transferring station of claim 4, characterized in that the Z slideway in the first carriage component comprises a helical spring that acts as traction spring, a first end of which is attached to the first carriage component and a second end of which is attached to the second carriage component.

6. The chip-transferring station of claim 4, wherein the suction-needle carriage is mounted under spring loading in the Z slideway of the guide block.

7. The chip-transferring station of claim 6, characterized in that the Z slideway of the guide block comprises a helical spring that acts as compression spring, a first end of which is braced against an abutment on the guide block and a second end of which is braced against an abutment on the suction-needle carriage.

8. The chip-transferring station of claim 6, wherein in the guide block there is provided, in association with the swivelling axle, a spiral spring that acts as compression spring, a first end of which is braced against an abutment in the guide block and a second end of which is braced against an abutment on the suction-needle carriage.

9. The chip-transferring station of claim 1, wherein the swivelling axle is a hollow structure that forms part of the vacuum conduit and is connected to a proximal end of the suction needle by way of a flexible or rigid connecting tubule.

10. The chip-transferring station of claim 1, wherein on the housing a first and a second stopping device are provided to delimit the 180° region through which the suction-needle holder can be swivelled.

\* \* \* \* \*

UNITED STATES PATENT AND TRADEMARK OFFICE
CERTIFICATE OF CORRECTION

PATENT NO. : 6,786,320 B2
DATED : September 7, 2004
INVENTOR(S) : Farhad Farassat It is certified that error appears in the above-identified patent and that said Letters Patent is hereby corrected as shown below:

<u>Title page,</u>
Item [73], Assignee, before "Ottobrunn" insert -- Daimlerstrasse 5 85521 --.

<u>Column 1,</u>
Line 64, delete "staion" and insert -- station --.

<u>Column 2,</u>
Line 22, after "and the" delete "the".

<u>Column 3,</u>
Line 53, after "steel" delete "is".

<u>Column 5,</u>
Line 27, delete "chip transferring" and insert -- chip-transferring --; and after "claim 1" insert -- , --.

Signed and Sealed this

Twenty-first Day of March, 2006

JON W. DUDAS
*Director of the United States Patent and Trademark Office*